US009634057B2

(12) United States Patent
Racine et al.

(10) Patent No.: US 9,634,057 B2
(45) Date of Patent: Apr. 25, 2017

(54) DIGITAL DETECTOR POSSESSING A GENERATOR OF LIGHT ENABLING OPTICAL WIPING

(71) Applicant: TRIXELL, Moirans (FR)

(72) Inventors: Benoit Racine, Moirans (FR); Robert Neyret, Coublevie (FR); Bruno Commere, Saint-Egreve (FR)

(73) Assignee: TRIXELL, Moirans (FR)

( * ) Notice: Subject to any disclaimer, the term of this patent is extended or adjusted under 35 U.S.C. 154(b) by 0 days.

(21) Appl. No.: 15/033,025

(22) PCT Filed: Nov. 4, 2014

(86) PCT No.: PCT/EP2014/073650
§ 371 (c)(1),
(2) Date: Apr. 28, 2016

(87) PCT Pub. No.: WO2015/063314
PCT Pub. Date: May 7, 2015

(65) Prior Publication Data
US 2016/0254311 A1 Sep. 1, 2016

(30) Foreign Application Priority Data
Nov. 4, 2013 (FR) ...................................... 13 60763

(51) Int. Cl.
*H01L 27/146* (2006.01)
*G01T 1/20* (2006.01)

(52) U.S. Cl.
CPC ...... *H01L 27/14663* (2013.01); *G01T 1/2018* (2013.01); *H01L 27/14603* (2013.01); *H01L 27/14676* (2013.01)

(58) Field of Classification Search
CPC ............. H01L 27/115; H01L 27/11526; H01L 27/11543; H01L 21/70; H01L 21/8247
See application file for complete search history.

(56) References Cited

U.S. PATENT DOCUMENTS

2007/0010036 A1* 1/2007 Endo ..................... G03F 7/0007
438/22
2008/0308739 A1 12/2008 Sawada et al.
2012/0126124 A1 5/2012 Nakatsugawa et al.

FOREIGN PATENT DOCUMENTS

DE 197 43 523 A1 4/1999
EP 2 528 113 A1 11/2012
FR 2 760 585 A1 9/1998
(Continued)

*Primary Examiner* — Roy Potter
(74) *Attorney, Agent, or Firm* — Baker & Hostetler LLP

(57) ABSTRACT

A solid-state radiation detector comprising a photosensitive sensor comprises photosensitive elements that are organized in a matrix, and a light generator whose purpose is to optically wipe the photosensitive elements. The light generator comprises: an electroluminescent layer that is distributed over the surface of the sensor; at least one electrode that continuously covers the electroluminescent layer and in which electrons may flow, the light emitted by the electroluminescent layer being capable of passing through the electrode; and additional electrical conductors that are in electrical contact with the electrode, the additional electrical conductors forming branches that extend over the surface of the electrode, and being spatially distributed across the surface of the electrode.

16 Claims, 4 Drawing Sheets

(56) References Cited

FOREIGN PATENT DOCUMENTS

FR          2 803 081 A1    6/2001
WO      2007/086485 A1    8/2007

* cited by examiner

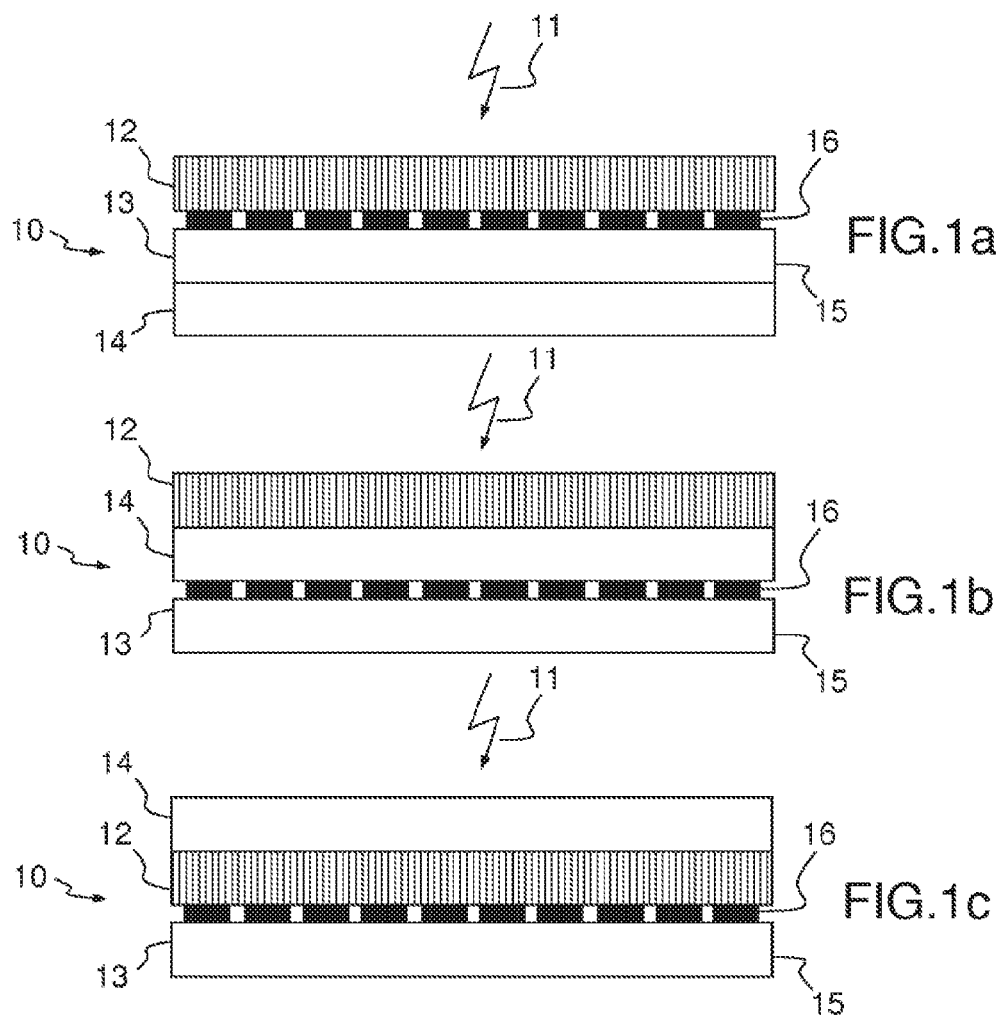
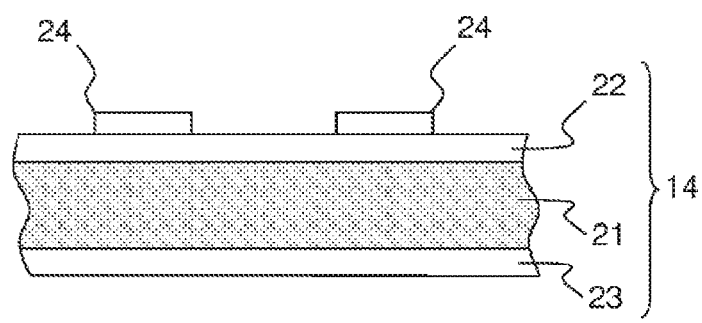
FIG.2a

DIGITAL DETECTOR POSSESSING A GENERATOR OF LIGHT ENABLING OPTICAL WIPING

CROSS-REFERENCE TO RELATED APPLICATIONS

This application is a National Stage of International patent application PCT/EP2014/073650, filed on Nov. 4, 2014, which claims priority to foreign French patent application No. FR 1360763, filed on Nov. 4, 2013, the disclosures of which are incorporated by reference in their entirety.

FIELD OF THE INVENTION

The present invention relates to a solid-state X-radiation detector comprising a photosensitive sensor that is able to be combined with a radiation converter. The fields of application of this type of detector are especially radiology: radiography, fluoroscopy, mammography, but also non-destructive testing.

BACKGROUND

Such radiation detectors are, for example, described in the French patent FR 2 803 081 in which a sensor formed from amorphous silicon photodiodes is combined with a radiation converter.

The operation and the structure of such a radiation detector will briefly be summarized.

The photosensitive sensor is generally made from solid-state photosensitive elements that are arranged in a matrix. The photosensitive elements are made from semiconductor materials, usually monocrystalline silicon for CCD or CMOS type sensors, polycrystalline silicon or amorphous silicon. A photosensitive element comprises at least one photodiode, phototransistor or photoresistor. These elements are deposited on a substrate, generally a glass plate.

These elements are generally not directly sensitive to very short wavelength radiation, such as X-radiation or gamma radiation. For this reason, the photosensitive sensor is combined with a radiation converter that comprises a layer of a scintillating substance. This substance has the property, when it is excited by such radiation, of emitting radiation of longer wavelength, for example visible or near-visible light, to which the sensor is sensitive. The light emitted by the radiation converter illuminates the photosensitive elements of the sensor, which carry out a photoelectric conversion and deliver electrical signals that are usable by suitable circuits. The radiation converter will be called a scintillator in the rest of the description.

In order to improve the quality of a useful image, correction of the useful image is carried out based on an image called the "offset image", or "dark image", that is generally taken and stored at the start of an operating cycle. This offset image is the image obtained when the photosensitive device is exposed to a zero-intensity signal and corresponds to a sort of background image. The offset image varies depending on the electrical state of the components of the photosensitive elements and on the dispersion in their electrical characteristics. The useful image is that read when the photosensitive device has been exposed to a useful signal that corresponds to exposure to X-radiation. It includes the offset image. The correction consists in subtracting the offset image from the useful image.

In order to produce a useful image or an offset image, an image cycle is made, i.e. a sequence formed by an image-taking phase followed by a readout phase, then a wipe and reset phase, as explained in the patent application FR-A-2 760 585. During the image-taking phase, the photosensitive elements are exposed to a signal to be detected, whether this signal is maximum illuminance or darkness. During the readout phase, a read pulse is applied to the addressed row conductors in order to read the amount of charge that accumulated while the image was being taken. During the wipe phase, the photosensitive elements are optically wiped by means of a flash of light that is uniformly distributed across all of the photosensitive points. During the reset phase, the photosensitive elements are restored to a state in which they are receptive to taking a new image. This restoration is carried out by temporarily making a switch, switching diode or transistor element conductive by means of an electrical pulse sent over row conductors, allowing the matrix to be addressed.

Currently, the flash of light is obtained by means of a light generator that is formed from a matrix of light-emitting diodes that is placed on the back face of the detector. By convention, the front face of the detector is referred to as the face exposed to the X-radiation and the back face as the face opposite the front face. During the flash of light, the matrix of light-emitting diodes emits visible radiation that passes through the glass plate forming the substrate of the photosensitive sensor, then is reflected off faces located upstream of the photosensitive sensor 13 before reaching the photosensitive elements. A light generator may also be produced by means of lamps that are again placed on the back face of the detector.

In certain medical imaging applications in which the detector is in motion during an examination, such as tomodensitometry, for example, a thin layer of air present between the light generator and the detector may vary in thickness with the movements of the detector. The variation in this layer of air may cause the formation of a ghost image of the light generator in the images issued by the detector. This ghost image is known in the literature by the term "grid effect".

Another drawback of light generators produced by means of light-emitting diodes or lamps resides in the thickness of such generators.

The placement of a layer of organic light-emitting diodes, referred to hereinafter as OLEDs, on the back face of the detector has also been attempted. This type of diode is made in the form of luminescent material positioned between two electrodes, at least one of which is transparent in order to allow light to be emitted outside the layer. For OLEDs, it is known practice to use a transparent electrode made of tin-doped indium oxide, referred to hereinafter as ITO for "indium tin oxide". This type of electrode is particularly suitable for OLED layers with small surface areas. Specifically, it has been observed that ITO has a high resistivity. For an OLED layer with a large surface area, the luminosity is not homogeneous. Brightness is greater at the edges than at the center of the layer. X-radiation detectors are necessarily of large size since it is practically impossible to focus this type of radiation due to its high energy. In medical radiology, digital detectors have been produced whose dimensions may be likened to those of the silver films used in the past. Currently, there are detectors whose dimensions exceed 400 mm per side. At such dimensions, the use of an OLED layer having an ITO electrode would not allow a homogeneous flash of light to be produced.

SUMMARY OF THE INVENTION

The invention aims to overcome all or some of the aforementioned problems by proposing a solid-state digital radiation detector in which a uniformly distributed flash of light allows the pixels to be reset. The invention is of considerable interest for the detection of X-radiation. It is nevertheless possible to implement the invention for other types of radiation, such as, for example, gamma radiation.

To this end, a subject of the invention is a solid-state digital detector for detecting incident radiation, the detector comprising a photosensitive sensor comprising photosensitive elements that are organized in a matrix and a light generator whose purpose is to optically wipe the photosensitive elements, characterized in that the light generator comprises:

an electroluminescent layer that is distributed over the surface of the sensor;

at least one electrode that continuously covers the electroluminescent layer and in which electrons may flow freely, the light emitted by the electroluminescent layer being capable of passing through the electrode;

and additional electrical conductors that are in electrical contact with the electrode, the additional electrical conductors forming branches that extend over the surface of the electrode (22, 23), and being spatially distributed across the surface of the electrode.

BRIEF DESCRIPTION OF THE DRAWINGS

The invention will be better understood and further advantages will become apparent upon reading the detailed description of various embodiments that are given by way of example, which description is illustrated by the attached drawing in which:

FIGS. 1a, 1b and 1c diagrammatically show, in cross section, multiple configurations of a digital detector according to the invention;

FIG. 2a diagrammatically shows, in cross section, an exemplary light generator 14 belonging to a digital detector according to the invention;

FIG. 4 diagrammatically shows, in enlarged cross section, a detector in the configuration of FIG. 1a;

For the sake of clarity, the figures are not to scale. Additionally, the same elements bear the same references in the various figures.

DETAILED DESCRIPTION

Figure 2B:
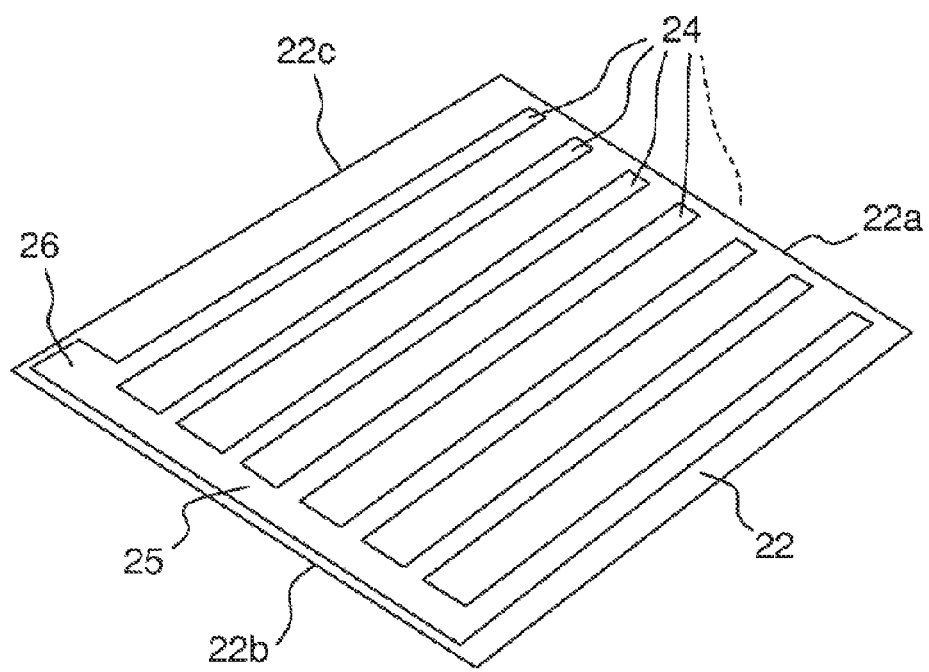
FIG. 2b shows, in perspective, an electrode and additional electrical conductors of the light generator 14.

A solid-state digital detector 10 according to the invention allows an image to be formed as a function of incident radiation to which it is sensitive, such as, for example, X-radiation 11. The detector 10 comprises a scintillator 12 that allows the X-radiation 11 to be converted to visible radiation, a photosensitive sensor 13 allowing the visible radiation issued by the scintillator 12 to be converted to electrical signals forming the image, and a light generator 14 whose purpose is to optically wipe the photosensitive elements of the sensor 13. Of course, the detector 10 may comprise other components. The invention may be implemented in a digital detector without a scintillator and whose sensor carries out a direct conversion of the radiation 11 to an electrical signal. To this end, the photosensitive sensor 13 comprises a photoconductor that is directly sensitive to the incident radiation.

More specifically, during the operation of the detector 10 to obtain an image, a sequence of operations is carried out, which sequence being formed by an image-taking phase during which the detector 10 is subjected to the X-radiation, followed by a readout phase during which the electrical signals issued by each of the photosensitive elements is read, then an optical wipe phase during which all of the photosensitive elements are uniformly illuminated, and finally a phase of electrically resetting all of the photosensitive points.

FIGS. 1a, 1b and 1c allow three configurations in which the invention may be implemented to be illustrated. By convention, the front face of the detector 10 is defined as the face that first receives the X-radiation, the back face being opposite the front face. The positions of the various components of the detector relative to one another are also defined with respect to the direction of propagation of the X-radiation. It would be said, for example, that the scintillator 12 is located upstream of the photosensitive sensor 13 as the scintillator 12 receives the X-radiation before the photosensitive sensor 13. In practice, the sensor 13 receives only very little of the X-radiation, as the X-radiation is almost entirely converted to visible radiation by the scintillator 12. The notion of upstream and downstream may also be extended to the direction of propagation of the visible radiation that is emitted by the scintillator 12 in the direction of the sensor 13.

In FIG. 1a, located from upstream to downstream, are: the scintillator 12, the sensor 13 and the light generator 14. Stated otherwise, the light generator 14 is located on the back face of the detector 10. The photosensitive sensor 13 comprises a substrate 15 and photosensitive elements 16. In this configuration, the flash of light emitted by the generator 14 in order to optically wipe the photosensitive points 16 passes through the substrate 15, passes between the photosensitive elements 16 and is reflected off faces located upstream of the photosensitive sensor 13 before reaching the upstream face of the photosensitive elements 16. More specifically, the flash of light may be reflected off a substrate of the scintillator 12 and/or at the interface between the scintillator 12 and the photosensitive sensor 13 on faces where an optical index discontinuity occurs. The substrate 15 must be transparent to the light emitted by the generator 14. This is the case when a glass plate is used to make the substrate 15. Stated otherwise, the photosensitive sensor 13 comprises a substrate 15 upon which the photosensitive elements 16 are positioned. The light generator 14 is positioned downstream of the substrate 15. The light emitted by the light generator 14 is capable of passing through the substrate 15.

This route for the flash of light is complicated and only part of the light emitted by the generator 14 is actually used to optically wipe the photosensitive elements 16. The emitted light directly reaching the back face of the photosensitive elements 16 does not contribute to the wipe owing to the opacity of the photosensitive elements 16. In this configuration, the fraction of light that reaches the photosensitive elements 16 is low and corresponds to the absence of material in a pixel. Moreover, before arriving at the photosensitive element 16, the light must be reflected off faces that are located upstream of the photosensitive sensor 13, thereby causing additional losses. It is common to obtain of the order of 10% useful light. The lost portion of light must be compensated for by increasing the luminous intensity and hence increasing the electrical consumption of the light generator 14. Nevertheless, this configuration may be useful since it allows the light generator 14 not to be placed upstream of the photosensitive elements 16.

In FIG. 1b, located from upstream to downstream, are: the scintillator 12, the light generator 14 and the sensor 13. Stated otherwise, the light generator 14 is located between the scintillator 12 and the photosensitive sensor 13. This configuration allows the entirety of the light emitted by the generator 14 to be used for the optical wipe, either via a direct route between the generator 14 and the photosensitive elements 16, or after reflection of the light emitted by the generator 15 off the scintillator 12. In the configuration of FIG. 1b, it is possible to substantially decrease the luminous intensity of the generator 14 with respect to the configuration of FIG. 1a for an equivalent result. This allows the electrical consumption of the light generator 14 to be reduced. However, the presence of the generator 14 between the scintillator 12 and the sensor 13 distances the scintillator 12 from the sensor 13, thereby negatively affecting the quality of the image issued by the detector 10 thus configured. This drawback is moderated, however, by the low thickness of the light generator 14. The saving in electrical consumption contributes to a saving in the thickness of the light generator 14.

FIGS. 1a and 1b may also illustrate a radiation detector without a scintillator whose photosensitive sensor 13 is directly sensitive to the incident radiation. For this, it is sufficient to remove the scintillator from FIGS. 1a and 1b. The photosensitive sensor 13 then comprises a photoconductor that is directly sensitive to the incident radiation 11.

In FIG. 1c, located from upstream to downstream, are: the light generator 14, the scintillator 12, and the sensor 13. Stated otherwise, the light generator 14 is located upstream of the scintillator 12. In this configuration, the scintillator 12 absorbs part of the light emitted by the generator 14. Part of the light emitted by the light generator 14 is lost, as in the configuration of FIG. 1a. The configuration of FIG. 1c is, however, of interest in that the homogeneity of the light received by the sensor 13 is improved. Specifically, the received light is not hindered by the photosensitive elements 16. Owing to this improved homogeneity, the configuration of FIG. 1c allows the generator 14 to be employed for other uses, such as for calibrating the pixels, for example.

In comparing the configurations of FIGS. 1b and 1c, by placing the light generator 14 between the scintillator 12 and the sensor 13, the light generator 14 does not interact with the X-radiation since it is absorbed by the scintillator 12. The risk of prematurely aging the light generator 14 is reduced, aging being able to occur in the configuration of FIG. 1c where the X-radiation passes through the light generator 14.

FIG. 2 shows, in cross section, an exemplary light generator 14 according to the invention. The light generator 14 comprises an electroluminescent layer 21. This layer is composed of a material that is capable of transforming electrical energy into light. This layer is, for example, formed by organic light-emitting diode 21. Today, multiple families of organic light-emitting diodes are known and may be implemented in the invention, such as, for example, organic light-emitting diodes, referred to hereinafter as OLEDs. Other types of layer may be implemented, such as, for example, a layer of polymer light-emitting diodes (PLEDs). OLEDs and PLEDs are organic layers. To implement the invention, it is not necessary for the electroluminescent layer to be organic. In the rest of the description, the term "OLED" will be used for any electroluminescent layer.

Additionally, the generator 14 comprises an electrode 22 through which the light emitted by the generator 14 is capable of passing before reaching the sensor 13. The electrode 22 may be transparent or translucent. The electrode 22 is positioned on one of the faces of the OLED layer by covering it in a continuous manner. A second electrode 23 is positioned on the other face of the OLED layer. The light emitted by the generator 14 is not necessarily capable of passing through the second electrode 23, except in the case of the configuration of FIG. 1b so that the light emitted by the scintillator 12 may pass through the light generator 14. The lights emitted by the light generator 14 and by the scintillator are generally of neighboring wavelengths located in the visible. The electrodes 22 and 23 are electrical conductors in which the electrons may flow freely. The electrodes are each connected to an electrical potential, by means of a connection pad, for example. The electrodes 22 and 23 are characterized by their electrical conductivity (expressed in $\Omega^{-1}$) that may be measured between two distant points of the electrode in question by applying a continuous voltage and measuring the current that flows. A surface conductivity of a rectangular electrode may be defined by dividing the conductivity measured between two opposite corners of the rectangle by the surface area of the rectangle.

The OLED layer is, for example, made by means of a stack of multiple layers: a layer for transporting holes, an emissive layer and a layer for transporting electrons. The transport layers are, for example, formed in a semiconductor material. By applying a voltage between the electrodes 22 and 23, electrons and holes penetrate the emissive layer. The electrons and holes combine while emitting photons according to the principle of luminescence.

In the configurations of FIGS. 1a and 1c, the second electrode 23 may be opaque to the light emitted by the generator 14. It may be made of a metal or alloy, for example. In the configuration of FIG. 1c, in which the light generator 14 is positioned upstream of the scintillator 12, the second electrode 23 may, for example, be made of aluminum alloy which has good transparency to X-radiation and may also play the role of entrance window and seal of the sensor 10. The aluminum alloy is able to ensure a good seal, allowing the scintillator 12 to be protected from any outside aggression. The scintillator 12 may, for example, be made of cesium iodide which is sensitive to moisture. The aluminum alloy of the second electrode 23 may therefore be used for encapsulating the scintillator 12 and protecting it from moisture.

The electrode 22 comprises, for example, tin-doped indium oxide, commonly known by its acronym ITO which stands for "indium tin oxide". This material is well known for its optical transparency properties when it is implemented in a thin layer. ITO also has good electrical conductivity properties. However, to retain good transparency, it is necessary to reduce its thickness, thereby degrading its electrical conductivity. Other metal oxides may be implemented, such as, for example, aluminum-doped zinc oxide, commonly known by its acronym AZO. To produce a transparent electrode, a metal layer whose thickness is of the order of nanometers, or even carbon nanotubes, may also be implemented. A common feature of all of these materials, allowing the electrode 22 to be produced, is that they may conduct electrons freely, i.e. passively and without any particular excitation. These materials have no forbidden band. Stated otherwise, the valance band and the conduction band overlap, unlike in semiconductor materials.

When using a light generator 14 to optically wipe the photosensitive elements 16 of the sensor 10, a single electrode, respectively 22 and 23, is positioned on each face of the OLED layer 21, covering the entirety of the OLED layer 21.

The supply of electrical power to the light generator 14 is done via its edges. For a generator 14 with a large surface area, the distance traveled by the current in the electrode 22 in order to supply power to the OLED layer 21 gets greater the further from the edges of the generator 14. This causes a drop in luminosity at the center of the generator 14 with respect to the luminosity obtained at its edges.

To overcome this problem, the light generator 14 according to the invention comprises additional electrical conductors 24 that are in electrical contact with the electrode 22 and form branches extending over the surface of the electrode 22. The additional electrical conductors 24 are spatially distributed across the surface of the electrode 22. The conductivity of the additional electrical conductors 24 is added to that of the electrode 22, thereby improving the overall conductivity of the assembly formed by the electrode 22 and the additional electrical conductors 24.

FIG. 2b shows, in perspective, the electrode 22 and the additional electrical conductors 24. The branches forming the additional electrical conductors 24 extend in parallel to one another, substantially between an edge 22a of the electrode 22 and an opposite edge 22b. In the case of a rectangular electrode 22, the branches are parallel to one side 22c of the rectangle, the edge 22c being perpendicular to the sides 22a and 22b. An electrical conductor 25 may be electrically connected to the branches 24. The conductor 25 is positioned along the edge 22b and outside the useful surface of the light generator 14. The electrode 22 and the additional conductors 24 are linked to a potential source by means of a connection pad 26 that is positioned in a corner of the electrode 22. Alternatively, the function of connection pad may be fulfilled by the electrical conductor 25.

Advantageously, the spatial distribution of the additional electrical conductors 24 is executed in a regular manner across the surface of the electrode 22, thereby allowing the uniformity of the light issued by the light generator 14 to be improved.

The regular distribution of the additional electrical conductors 24 allows the overall luminosity of the light generator 14 to be homogenized. A drop in luminosity is obtained between each branch. The drops in luminosity are distributed across the surface of the generator 14. These drops in luminosity are smaller than the drop in luminosity obtained in the absence of additional electrical conductors 24. The number of additional electrical conductors 24, and hence their spacing, is chosen according to the desired level of homogeneity.

The additional electrical conductors 24 are, for example, opaque to the light emitted by the light generator 14, thereby allowing the choice of possible materials for producing these conductors to be increased. The additional electrical conductors 24 may, for example, be made of metal or metal alloy, thereby allowing a conductivity that is much greater than that of the electrode 22 to be obtained. By way of example, the additional conductors may be made of aluminum, gold, platinum or an alloy of these metals. The conductivity of the opaque conductors 24 becomes dominant in the overall conductivity and the decrease in luminosity occurs only between each opaque additional electrical conductor 24.

In medical radiology, it is common to implement a square-shaped detector of 430 mm per side. By means of a metal, 5 to 10 µm wide additional electrical conductor 24, an electrical resistance of less than 3 kΩ over its 430 mm length may be obtained for this conductor. Internal tests have shown that by means of such additional conductors, a spatial luminous homogeneity of more than 80% may be obtained.

The electrical conductors 24, 25 and the pad 26 may be produced in the same material.

Figure 3:
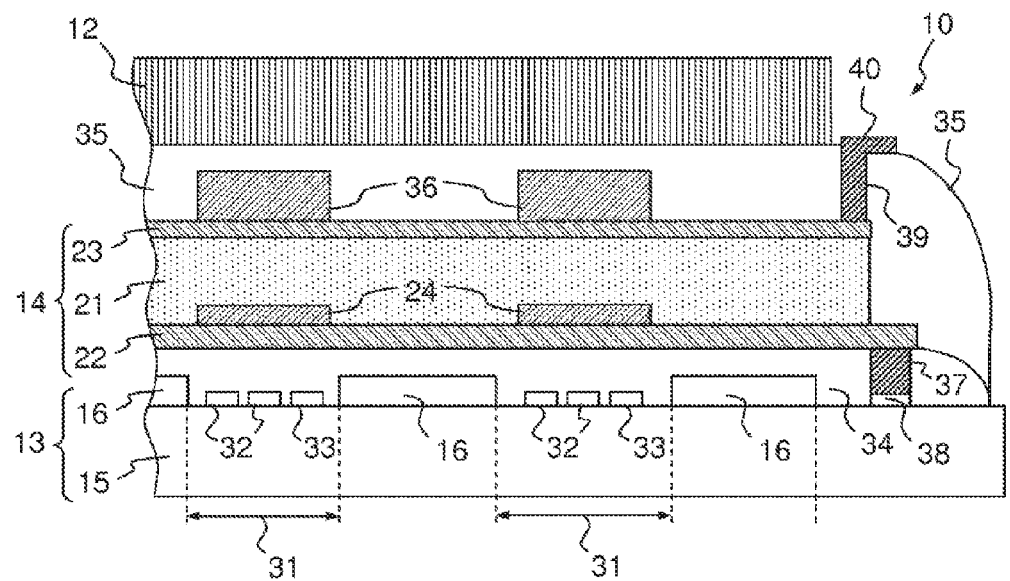
FIG. 3 diagrammatically shows, in enlarged cross section, a detector in the configuration of FIG. 1b.

FIG. 3 shows, in enlarged cross section, the detector of the configuration of FIG. 1b in which the light generator 14 is positioned between the sensor 13 and the scintillator 12. The structure of the light generator 14 shown with the aid of this configuration may be applied to the other configurations described with the aid of FIGS. 1a and 1c. The photosensitive sensor 13 comprises photosensitive elements that are organized in a matrix. In FIG. 3, three photosensitive elements 16 appear. In practice, a photosensitive sensor 13 may comprise a large number of photosensitive elements 16, of the order of millions, for example. The photosensitive elements 16 do not cover the entirety of the surface of the photosensitive sensor 13. Interstices 31 are formed between neighboring photosensitive elements 16. Components 32 may be positioned within the interstices 31. The components 32 allow the photosensitive elements 16 to operate. There is, for example, a follower transistor, a readout transistor and a reset transistor that are associated with each of the photosensitive elements 16. The term "pixel" refers to the assembly formed by a photosensitive element and the associated components 32. Electrical conductors 33 also run in the interstices 31, allowing the various photosensitive elements 16 to be supplied with power, controlled and read through the components 32.

For the configurations described with the aid of FIGS. 1b and 1c, i.e. when the light generator 14 is positioned upstream of the photosensitive sensor 13 in the direction of propagation of the radiation 11, the additional electrical conductors 24 are advantageously positioned facing the interstices 31 that separate the photosensitive elements 16. The additional electrical conductors 24 may reduce the transmission of the light emitted by the generator 14 without hindering the efficacy of the generator 14 regarding the photosensitive elements 16. It is even possible to implement opaque additional electrical conductors 24 without any hindrance.

In the example shown in FIG. 3, the additional electrical conductors 24 do not cover the photosensitive elements 16. Alternatively, it is possible to accept a partial coverage of the photosensitive elements 16 by the additional electrical conductors 24. This coverage may be due to the dimensions of the interstices 31. These dimensions are not necessarily constant at the periphery of a photosensitive element 16. In the configuration of FIG. 1b, the additional electrical conductors 24 may hinder the transmission of the light emitted by the scintillator 12 and the partial coverage impairs the collection of the light emitted by the scintillator 12 by the photosensitive elements 16. However, this problem does not exist in the other configurations of FIGS. 1a and 1c.

The level of coverage is determined according to a compromise between the efficacy of the generator 14 regarding the photosensitive elements 16 and the improvement in the electrical conductivity of the assembly formed by the electrode 22 and the additional electrical conductors 24.

In the configuration of FIG. 1b in which the light generator is placed between the scintillator 12 and the sensor 13, the light generator 14 is completely transparent to the light emitted by the scintillator 12 in the direction of the sensor 13. The presence of the additional electrical conductors 24 allows the thickness of the electrode 22 to be reduced, thereby improving the transparency of the light generator regarding the light emitted by the scintillator 12.

Figure 4:
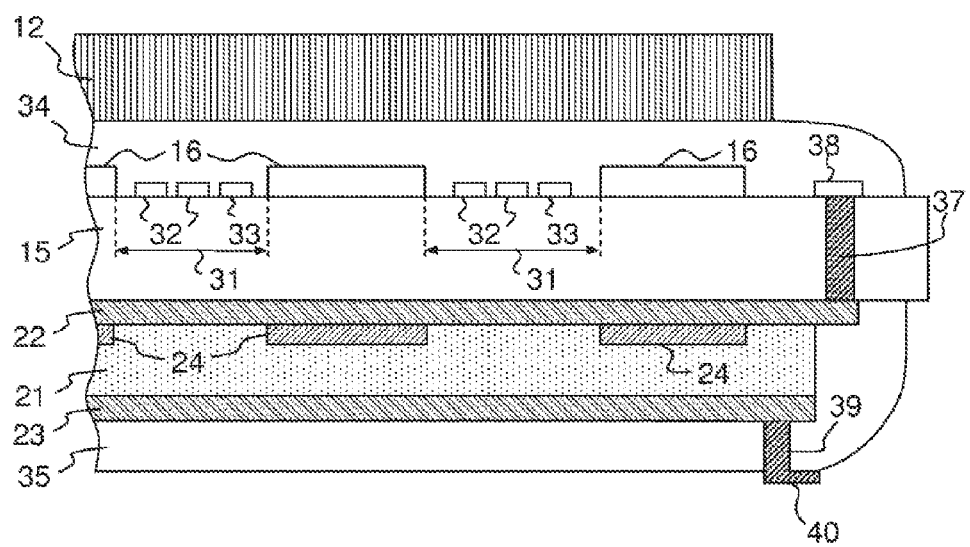

FIG. 4 shows, in enlarged cross section, the detector of the configuration of FIG. 1a in which the light generator 14 is positioned between the back face of the photosensitive sensor 13. Stated otherwise, the light generator 14 is positioned downstream of the photosensitive sensor 13 in the direction of propagation of the radiation 11.

In this configuration, the additional electrical conductors 24 are advantageously positioned facing opaque areas of the photosensitive sensor 13. In particular, the opaque areas are areas in which the photosensitive elements 16 are located. The photosensitive sensor 13 has transparent areas, in particular in the interstices 31 and, more specifically, between the components 32. The additional electrical conductors 24 do not hinder the transmission of the light emitted by the light generator 14 toward the transparent areas of the photosensitive sensor 13.

The photosensitive elements 16 are regularly distributed across the surface of the sensor 14. Advantageously, the regularity of distribution of the additional electrical conductors 24 is multiple of that of the photosensitive elements 16. An additional electrical conductor 24 may be placed facing each interstice 31 in the variant of FIG. 3, or facing each photosensitive element 16 in the variant of FIG. 4. It is also possible to space the additional electrical conductors 24 and to cover only one out of N interstices 31 or photosensitive elements 16, N being an integer that is greater than 1. This number N is chosen according to the acceptable decrease in luminosity between two additional electrical conductors 24.

Figure 5:
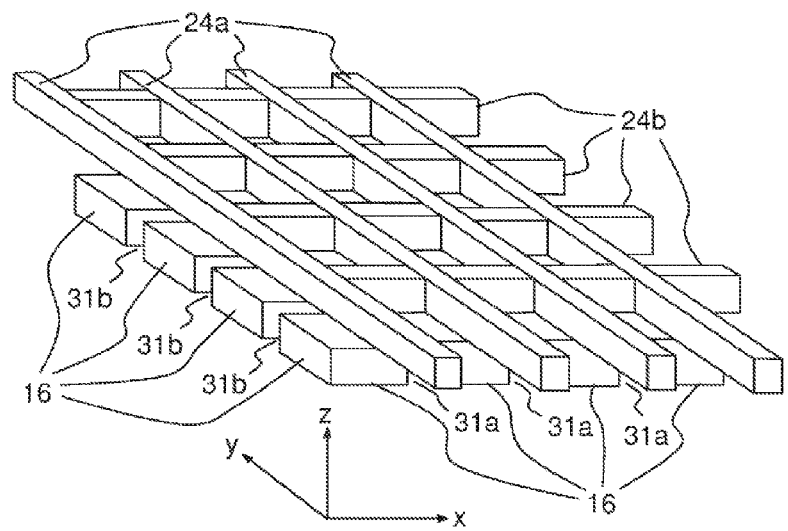
FIG. 5 illustrates an exemplary distribution of additional electrical conductors of the detector.

FIG. 5 illustrates an exemplary distribution of additional electrical conductors 24 facing the interstices 31. So as not to overburden the figure, only photosensitive elements 16 and additional electrical conductors 24 are shown in perspective. The photosensitive elements 16 are organized in a matrix along perpendicular directions x and y. A direction z is perpendicular to the directions x and y. Interstices 31a separate the photosensitive elements 16 along the direction x and interstices 31b separate the photosensitive elements 16 along the direction y. Additional electrical conductors 24a are positioned facing the interstices 31a and additional electrical conductors 24b are positioned facing the interstices 31b. Stated otherwise, the additional electrical conductors 24a have the same abscissa along the x-axis as the interstices 31a and the additional electrical conductors 24b have the same ordinate along the y-axis as the interstices 31b. The indices a and b that are associated with the interstices and with the additional electrical conductors are present only for dissociating the two directions x and y. The indexed objects have, of course, the same characteristics as those presented above without indices.

In the example illustrated in FIG. 5, additional electrical conductors 24a or b cover all of the interstices 31a or b. As mentioned above, it is possible to have additional electrical conductors for only every N interstices 31a or b. It is possible to have additional electrical conductors 24a for every N interstices 31a and additional electrical conductors 24b for every M interstices 31b, where N differs from M.

This crossed distribution of the additional conductors is, of course, transferable to the variant of FIG. 4. The additional electrical conductors 24a or b then cover the photosensitive elements 16. Stated otherwise, the additional electrical conductors comprise a first series of mutually parallel branches 24a and a second series of mutually parallel branches 24b. The first series 24a and the second series 24b intersect.

Furthermore, it is possible to have additional electrical conductors in only one of the two directions x or y.

The detector 10 may comprise a passivation layer 34 that is positioned between the photosensitive sensor 13 and the light generator 14. This layer is, for example, made of silicon nitride. In the absence of the light generator 14 between the scintillator 12 and the sensor 13, it is useful to position a barrier layer between the passivation layer and the scintillator in order to protect the sensor 13 from potential decomposition products of the scintillator 12. The presence of the light generator 14 between the scintillator 12 and the sensor 13 allows this barrier layer to be omitted.

The light generator 14 is advantageously encapsulated. Specifically, the OLED layer 21 must be isolated from the atmosphere. Specifically, the OLED layer 21 is severely degraded when subjected to moisture. The encapsulation is produced by means of a layer 35 that covers the second electrode 23 and the lateral faces of the light generator 14. The encapsulation may be produced between two sheets of glass, which is achievable in the configurations of FIGS. 1a and 1c in which the light generator is positioned outside an assembly formed by the photosensitive sensor 13 and the scintillator 12. For the configuration of FIG. 1b in which the light generator is positioned between the photosensitive sensor 13 and the scintillator 12, a barrier film that is commonly implemented in OLED layers is preferably used.

It is possible to omit the passivation layer 34 and to directly produce the light generator 14 on the sensor 13. The encapsulation layer 35 then covers the light generator 14 and the photosensitive elements 16.

In the configurations of FIGS. 1a and 1c, in which the light emitted by the scintillator 12 does not pass through the light generator 14, the second electrode 23 may be completely opaque to visible light. In these configurations, there are few constraints on the thickness of the electrode 23 and a metal sheet may be used, for example an aluminum alloy whose electrical conductivity is sufficiently high, over the entirety of the surface of the detector 10. On the other hand, in the configuration of FIG. 1b in which the light emitted by the scintillator 12 passes through the light generator 14, the second electrode 23 must be sufficiently transparent. Today, semi-transparent metal electrodes exist. Their transparency is of the order of 70%. It is desirable to improve the transparency of this electrode. This may be achieved by reducing its thickness, but this reduction poses the same problem as for the electrode 22 in decreasing the electrical conductivity. As an alternative to a semi-transparent metal electrode, it is possible to make the second electrode of ITO.

As for the electrode 22, it is possible to add additional electrical conductors 36 to the electrode 23 that are in electrical contact with the electrode 23. As for the electrode 22, the additional electrical conductors 36 are spatially distributed regularly across the surface of the electrode 23. Their distribution is advantageously identical to that of the additional electrical conductors 24.

The additional electrical conductors 24 and 36 may be made of thick metal material, such as aluminum or chromium alloy, for example. It is possible to position the additional electrical conductors 24 and 36 inside or outside the OLED layer 21.

The electrical connection of the two electrodes 22 and 23 is made at the edges of the light generator 14. In the configuration of FIG. 1b, shown in more detail in FIG. 3, the electrode 22 is located in the immediate vicinity of the sensor 13. It is possible to ensure connection to the electrode 22 via the substrate 15. This substrate already bears the photosensitive elements, the components 32 and the electrical conductors 33. To this end, the detector 10 comprises a via 37 that connects the electrode 22 to a conductor 38 that is produced on the substrate. The via 37 passes through the passivation layer 34. This connection method may also be implemented in the configuration of FIG. 1a, shown in more detail in FIG. 4, in which the light generator 14 is located on the back face of the detector 10. In this configuration, the via 37 passes through the substrate 15. Ensuring an electrical connection via the substrate 15 allows the existing connection means to be used by connecting the sensor 13 to the circuits for controlling and reading the detector 10 that may be positioned on separate substrates of the substrate 15.

The electrical connection of the electrode 23 may be made by means of another via 39 that passes through the encapsulation layer 35 for FIGS. 3 and 4. The via 39 connects the electrode 23 and a pad 40 that is produced on the encapsulation layer 35 by means of metal deposition, for example. The connection of the pad 40 to the circuits for controlling the detector 10 is, for example, achieved by means of a flexible printed circuit board (not shown).

The OLED layer 21 may be continuous over its entire surface, as shown in FIGS. 3 and 4. Alternatively, the OLED layer 21 may be discontinuous. The OLED layer 21 is, for example, interrupted at the level of the additional electrical conductors 24. Specifically, as these conductors may be opaque, or at the very least reduce the transmission of the light passing therethrough, luminescent material facing the additional electrical conductors 24 may be omitted. This allows an improved distribution of the voltage applied to the OLED layer 21, and hence an improved uniformity of the light, to be obtained.

Figure 6:
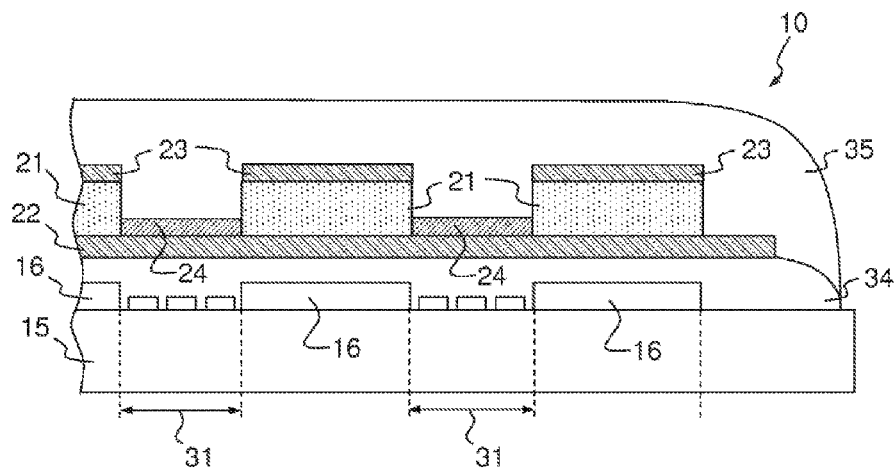
FIG. 6 diagrammatically shows, in enlarged cross section, a variant of the detector in the configuration of FIG. 1b.

FIG. 6 illustrates an exemplary embodiment of the sensor 10 in which the OLED layer 21 is discontinuous. FIG. 6 corresponds to the configuration of FIGS. 1b and 3. As in FIG. 3, the electrode 22 shown in FIG. 6 is positioned on the passivation layer 34. It is recalled that the passivation layer 34 is optional. The electrode 22 is continuous and the additional electrical conductors 24 are located in a position facing the interstices 31 that separate the photosensitive elements 16. The OLED layer 21 is deposited facing the photosensitive elements 16 and is interrupted when facing the interstices 31.

The electrode 23 may be discontinuous, as shown in FIG. 4, or again continuous over the entire surface of the OLED layer 21.

In the configurations of FIGS. 1b and 1c in which the light generator 14 is positioned upstream of the sensor 13, the discontinuities in the OLED layer 21 are positioned facing the interstices 31 that separate the photosensitive elements 16. In the configuration of FIG. 1a in which the light generator 14 is positioned downstream of the sensor 13, the discontinuities in the OLED layer 21 are positioned facing opaque areas of the sensor 13, in particular facing the photosensitive elements 16.

The invention claimed is:

1. A solid-state digital detector for detecting incident radiation, the detector comprising a photosensitive sensor comprising photosensitive elements that are organized in a matrix, a light generator whose purpose is to optically wipe the photosensitive elements, wherein the light generator comprises:
an electroluminescent layer that is distributed over the surface of the sensor;
at least one electrode that continuously covers the electroluminescent layer and in which electrons may flow freely, the light emitted by the electroluminescent layer being capable of passing through the electrode;
and additional electrical conductors that are in electrical contact with the electrode, the additional electrical conductors forming branches that extend over the surface of the electrode, and being spatially distributed across the surface of the electrode.

2. The detector as claimed in claim 1, wherein the photosensitive elements are regularly distributed across the surface of the sensor.

3. The detector as claimed in claim 2, wherein the distribution of the additional electrical conductors is regular and multiple of that of the photosensitive elements.

4. The detector as claimed in claim 1, wherein the additional electrical conductors comprise a first series of mutually parallel branches and a second series of mutually parallel branches and wherein the first series and the second series intersect.

5. The detector as claimed in claim 1, comprising a scintillator that converts the incident radiation to a second type of radiation to which the sensor is sensitive.

6. The detector as claimed in claim 1, wherein the photosensitive sensor comprises a photoconductor that is directly sensitive to the incident radiation.

7. The detector as claimed in claim 1, wherein the additional electrical conductors are opaque to the light emitted by the light generator.

8. The detector as claimed in claim 1, wherein the light generator is positioned upstream of the photosensitive sensor in the direction of propagation of the first type of radiation, wherein interstices are formed between neighboring photosensitive elements and wherein the additional electrical conductors are positioned facing interstices that separate the photosensitive elements.

9. The detector as claimed in claim 8, wherein the additional electrical conductors do not overlap the photosensitive elements.

10. The detector as claimed in claim 5, wherein the light generator is positioned upstream of the photosensitive sensor in the direction of propagation of the first type of radiation, wherein interstices are formed between neighboring photosensitive elements and wherein the additional electrical conductors are positioned facing interstices that separate the photosensitive elements and wherein the light generator is positioned between the scintillator and the photosensitive sensor.

11. The detector as claimed in claim 10, comprising a passivation layer that is positioned between the photosensitive sensor and the light generator.

12. The detector as claimed in claim 5, wherein the additional electrical conductors are opaque to the light emitted by the light generator and wherein the light generator is positioned upstream of the scintillator in the direction of propagation of the first type of radiation.

13. The detector as claimed in claim 1, wherein the light generator is positioned downstream of the photosensitive sensor in the direction of propagation of the first type of radiation and wherein the additional electrical conductors are positioned facing opaque areas of the photosensitive sensor.

14. The detector as claimed in claim 13, wherein the photosensitive sensor comprises a substrate on which the photosensitive elements are positioned, wherein the light generator is positioned downstream of the substrate and wherein the light emitted by the light generator is capable of passing through the substrate.

15. The detector as claimed in claim 1, wherein the electroluminescent layer is interrupted at the level of the additional electrical conductors.

16. The detector as claimed in claim 1, wherein the additional electrical conductors are made of metal or metal alloy.

\* \* \* \* \*